United States Patent [19]

Itoyama et al.

[11] Patent Number: 5,849,107
[45] Date of Patent: Dec. 15, 1998

[54] SOLAR BATTERY MODULE AND PASSIVE SOLAR SYSTEM USING SAME

[75] Inventors: Shigenori Itoyama; Kimitoshi Fukae, both of Nara; Masahiro Mori, Tsuzuki-gun; Yuji Inoue, Nara; Fumitaka Toyomura, Soura-gun; Takashi Ohtsuka, Tsuzuki-gun, all of Japan

[73] Assignee: Canon Kabushiki Kaisha, Tokyo, Japan

[21] Appl. No.: 680,793

[22] Filed: Jul. 16, 1996

Related U.S. Application Data

[63] Continuation of Ser. No. 348,938, Nov. 25, 1994, Pat. No. 5,589,006.

[30] Foreign Application Priority Data

Nov. 30, 1993 [JP] Japan ................................. 5-299819

[51] Int. Cl.⁶ .................. E04D 13/18; H01L 31/058; H01L 31/048
[52] U.S. Cl. .................. 136/248; 52/173.3; 136/251; 136/291; 126/623; 437/4; 437/211; 437/215; 437/219
[58] Field of Search .................. 136/251, 248, 136/291; 52/173.3; 126/623; 437/4, 211, 215, 219

[56] References Cited

U.S. PATENT DOCUMENTS

| | | | |
|---|---|---|---|
| 5,092,939 | 3/1992 | Nath et al. | 136/251 |
| 5,232,518 | 8/1993 | Nath et al. | 136/251 |
| 5,252,141 | 10/1993 | Inoue et al. | 136/251 |
| 5,338,369 | 8/1994 | Rawlings | 136/246 |
| 5,391,235 | 2/1995 | Inoue | 136/244 |
| 5,409,549 | 4/1995 | Mori | 136/244 |
| 5,457,057 | 10/1995 | Nath et al. | 437/2 |
| 5,480,494 | 1/1996 | Inoue | 136/251 |
| 5,530,264 | 6/1996 | Kataoka et al. | 257/40 |

FOREIGN PATENT DOCUMENTS 3-48299  7/1991  Japan ................................. E04B 1/74

*Primary Examiner*—Aaron Weisstuch
*Attorney, Agent, or Firm*—Fitzpatrick, Cella, Harper & Scinto

[57] ABSTRACT

A solar cell module in which the reduction in conversion efficiency is small, and a passive solar heating system using the solar cell module. The solar cell module has a solar cell covered with a filler. A back reinforcement member, the filler and a back insulating member larger than the solar cell are superposed on the non-light-receiving side of the solar cell. The back insulating member has openings corresponding to pierced portions of the solar cell module at which the solar cell module is affixed to a roof. A greater amount of clean energy is obtained with the system. The solar cell is used without any additional base to limit the reduction in the conversion efficiency of the solar cell.

69 Claims, 7 Drawing Sheets

PRIOR ART

SOLAR BATTERY MODULE AND PASSIVE SOLAR SYSTEM USING SAME

This application is a continuation of application Ser. No. 08/348,938 filed Nov. 25, 1994, now U.S. Pat. No. 5,589,006, issued Dec. 31, 1996.

BACKGROUND OF THE INVENTION

1. Field of the Invention

The present invention relates to a solar battery module which is easy to install, specifically to a solar module for use in a passive solar heating system in which solar heat energy is utilized by being converted into a heated flow of a thermal medium, particularly air.

2. Description of the Related Art

People in many regions in the world are now becoming acutely aware of environmental problems. In particular, mankind has strong apprehensions about the global warming phenomenon due to exhaust of $CO_2$.

There is, therefore, an increasing demand for safe, clean energy sources. Presently a solar battery using a photoelectric conversion element is one of several promising clean energy sources because it is safe and easy to handle.

There are various types of solar batteries, such as:

(1) single crystal silicon solar cell,
(2) polycrystal silicon solar cell,
(3) amorphous silicon solar cell,
(4) copper-indium selenide solar cell, and
(5) compound semiconductor solar cell.

Recently, thin-film crystalline silicon solar cells, compound semiconductor solar cell and amorphous silicon solar cells among such cells have been studied and developed in various aspects because they can be formed a large-area elements at a comparatively low cost.

Figure 8:
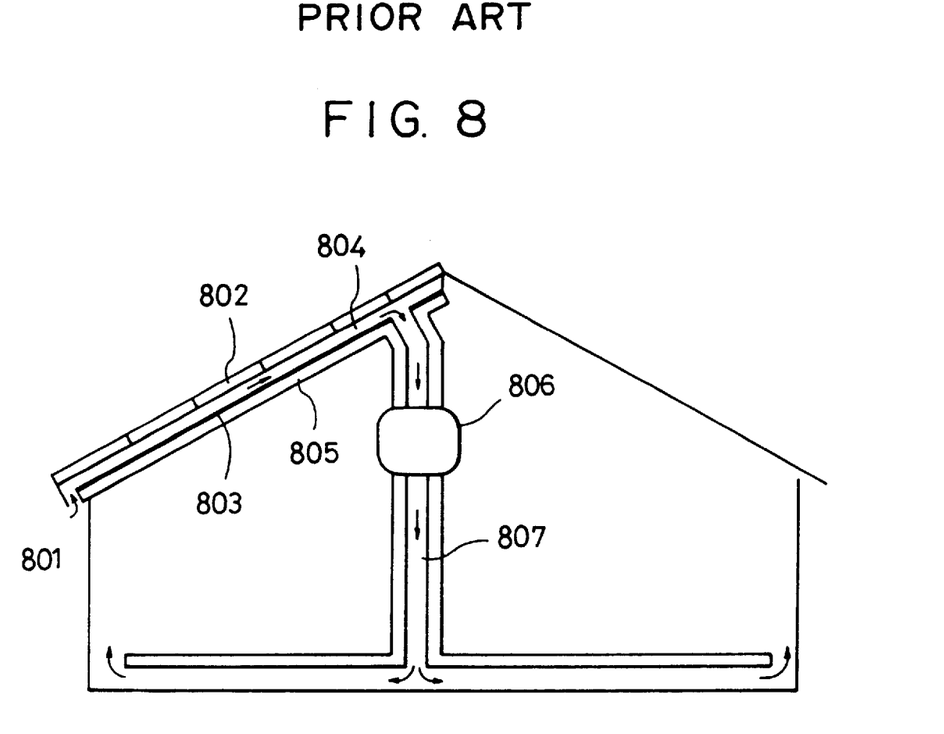
FIG. 8 is a diagram of an example of an air heating type passive solar system.

Japanese Patent Publication No. 48299/1991 discloses a passive solar system for utilizing a clean energy source, in which solar heat is collected by using a roof surface and is utilized for floor heating, hot-water supply, and the like. FIG. 8 shows an example of such a passive solar system, i.e., an air-heating type passive solar system. In the system shown in FIG. 8, fresh air enters a vent layer 804 formed on a roof board 803 through an outside air inlet 801 formed at the edge of an eaves and rises naturally and slowly toward the ridge of a roof while becoming warmer by receiving solar heat radiated to the roof surface through heat collecting metallic roofing plates 802. This warm air is supplied to a space formed under a floor via an air duct 807 by a fan 806, thereby to heat the entire space. The vent layer 804 and the air duct 807 are covered with a heat insulating material 805 in order to prevent heat from escaping.

The above-described air-heating type passive solar system utilizes solar heat as clean energy. However, the total amount of energy utilized by the system cannot be said to be obtained only from clean energy sources because it is necessary to use electrical power from a power line for the blower fan. Therefore, a method of using a solar cell, which is one of the existing clean energy sources, as a power source of the fan in the above-described system has been proposed. However, if the solar cell is mounted on the roof in an area away from the shingles or roof plates, it is necessary to increase the area of the roof. If the roof area is restricted, it is necessary to mount the solar cell in a different place. In such a case, an additional base for mounting the solar cell is required. In consideration of this problem, the applicants of the present invention have proposed a solar system in which a resin-molded type solar cell module, such as that shown in FIGS. 9(a) and 9(b), exhibiting more effective release of heat to the air in the vent layer is used in place of a metallic heat collecting plate.

Figure 9A:
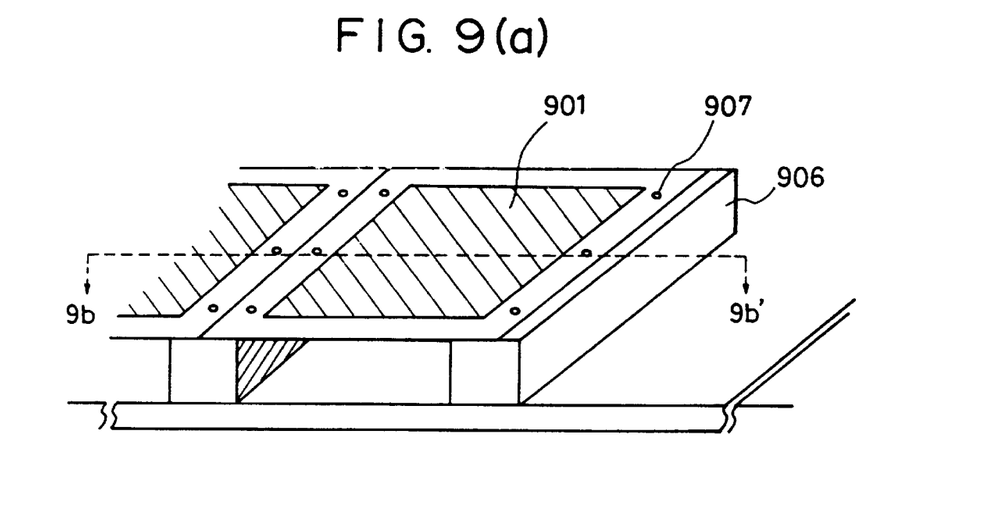
FIG. 9(a) is a schematic diagram of an example of a solar cell module shown for comparison with the present invention.
Figure 9B:
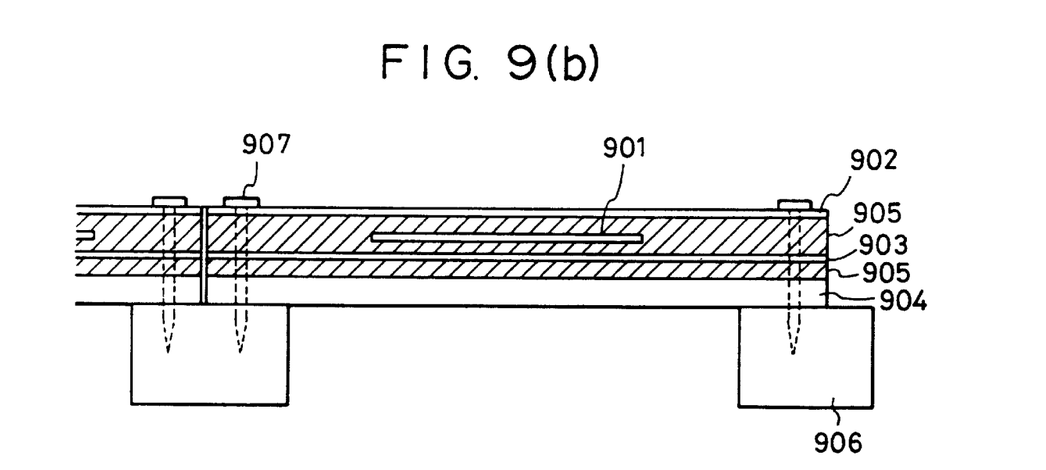
FIG. 9(b) is a cross-sectional view taken along the line 9b–9b' of FIG. 9(a)

FIGS. 9(a) and 9(b) illustrate an example of a solar system proposed by the applicants of the present invention. A solar cell module is mounted by nailing onto roofing members. This mounted structure is shown as an example in contrast to the conventional art and the present invention. FIG. 9(a) is a top-side perspective view and FIG. 9(b) is a cross-sectional view taken along the line 9b–9b' of FIG. 9(a). The drawings illustrate a solar cell 901, a surface cover member 902, a back insulating member 903, a back reinforcement member 904 which serves as a heating collecting surface, a filler member 905, roofing member 906 which also serves as a spacer, and nails 907. As illustrated, the solar cell module can be easily fixed on a roof by being nailed or stapled at a non-generating location. Thus, it is possible to mount the solar cell module on the roof without requiring a large change in the conventional architecture.

The solar system of this comparative example proposed by the applicants of the present invention, however, presents the problem of a possibility of the initial characteristics of the solar cell module being changed after use over a long period of time, i.e., about 20 years.

It is known, however, that the conversion efficiency of a solar cell is reduced if the ambient temperature is increased. If a solar cell is placed on a roof, and is kept at a high temperature, the photo-electric conversion efficiency is considerably reduced. In such a case, it is necessary to cool the solar cell to limit the reduction in conversion efficiency.

SUMMARY OF THE INVENTION

An object of the present invention is to provide a solar cell module which has improved long-term reliability of use when maintained in a fixed state, ensuring utilization of totally clean energy in an air heating type passive solar system, which can be used without requiring additional base, and which is capable of limiting the reduction in conversion efficiency due to heat.

The inventors have made various studies to achieve this object and have found that a solar cell as described below is the most preferred.

According to the present invention, a solar cell module is provided wherein a solar cell is covered with a filler, the solar cell module comprising a lamination in which a back reinforcement member, the filler, and a back insulating member larger than the solar cell are superposed in this order on the non-light-receiving side of the solar cell, the back insulating member having an opening corresponding to at least one pierced portion for fixing the solar cell module. There is also provided a passive solar system having the thus-constructed solar cell module.

According to a further aspect of the present invention, there is also provided a passive solar system having the above-described solar cell module. Such passive solar system is one in which a vent layer is formed between a roof board and a roofing plate provided over the roof board and in which solar heat absorbed through the roofing plate is converted into a heated air flow. The solar system comprises a solar cell module having a solar cell covered with a filler, a back reinforcement member, and a back insulating member larger than said solar cell, said back reinforcement layer, said filler, and said back insulating member being superposed in this order on the non-light receiving side of the solar cell, and the back insulating member having an opening corresponding to at least one pierced portion for accommodating a fixing means for affixing the solar cell module.

According to the solar cell module of the present invention, the advantages described below can be expected.

(1) Deterioration of the laminated members at pierced locations can be decreased, so that the solar cell module has improved long-term reliability.

(2) Heated air can be circulated by using a fan operated by generated solar cell power, thereby making it possible to utilize a larger amount of clean energy.

(3) If the solar cell generates an amount of power larger than that required to drive the fan and other components, surplus power can be utilized for other purposes (e.g., commercial power etc.) by being supplied through a power converter.

(4) The solar cell can be used without requiring an additional base.

(5) The reduction in the conversion efficiency of the solar cell due to heat can be lessened.

DESCRIPTION OF THE PREFERRED EMBODIMENT

The inventors conducted an experiment in which a solar cell module fixed directly on a roof member by being nailed as shown in FIGS. 9(a) and 9(b) was used under conditions of irradiation-rain cycles, and the external appearance and a cross-section of the solar cell module were thereafter examined. The result of this experiment showed crack lines formed in the back insulating member 903 around nails 907, and the interfacial surfaces of the back insulating member 903 and the filler 905 partially separated from each other. It was found that during outdoor use the laminated members were subjected to stresses at the nailed positions by forces applied through the nails, and that cracking and film separation occurred particularly in the back insulating member 903 by stresses due to forces applied through the nails from environmental factors and by stresses caused in the filler 905 and the back insulating member 903 by the nails, so that water easily penetrated to the back insulating member. It is thought (as seen in FIGS. 1a–1d) that in the case of also using roofing plate 107 as a heat collecting metal surface, the photo-electric conversion efficiency and the insulation breakdown voltage are seriously reduced because the solar cell module is heated at a high temperature in a high-humidity condition through vent layer 105. The same problem was also encountered, for example, in a case where through holes were formed in the solar cell module and where the solar cell module was fixed with bolts and nuts passed through the through holes.

Figure 10:
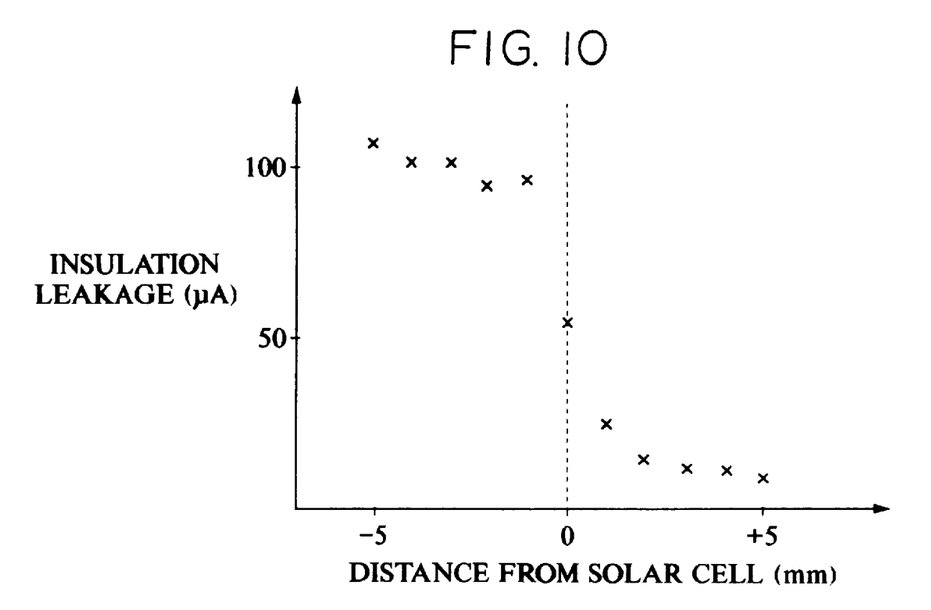
FIG. 10 is a graph showing the relationship between insulation leakage and the distance from the solar cell as the result of an experiment conducted with the present invention.

Another experiment was conducted to examine the influence of openings formed in pierced portions of the back insulating member 903 through which nails 907 are passed and the result of this experiment is shown in FIG. 10.

FIG. 10 shows the relationship between insulation current leakage of the solar cell module and the distance between the ends of the solar cell 101 and the back insulating member 109 (hereinafter referred to as "the distance from the solar cell"). Three samples were tested with respect to each graph point and the result of the test is represented by average values.

Each test sample was made by laminating the members in the order of roofing plate 107, filler 110, back insulating member 109, filler 110, solar cell 101, filler 110 and surface cover member 108 wherein melted ethylene-vinyl acetate copolymer (EVA) provided as the filler at 150° C. for 30 minutes using a vacuum laminator (not shown). A zinc-coated steel plate (a product of Daido Steel Sheet Corp. under the trade name of TAIMACOLOR GL) was used as roofing plate 107. Nylon (a product of Du Pont under the trade name of DARTEK) was used as back insulating material 109. A fluorocarbon resin (tetrafluoroethylene, a product of Asahi Glass Co., Ltd. under the trade name of AFLEX) was used as surface cover member 108. The test was conducted by forming the solar cell modules with vent layers in accordance with the structure shown in FIG. 1.

In FIG. 10 the plus sign for the distance between the ends of solar cell 101 and back insulating member 109 indicates that the back insulating member 109 width is larger than the width of the solar cell 101 while the minus sign indicates that the back insulating member 109 width is smaller than the distance of the solar cell 101. The members were laminated under the same conditions with respect to the four sides of solar cell 101.

The insulation current leakage was conducted in such a manner that each solar cell module was kept in an environment of 85° C. and 85% RH for 500 hours, and a maximum leakage current was measured during application of a voltage of 2,200 V to the solar cell module for one minute within 2 minutes after the time when the solar cell module removed from the test environment. Measuring terminals were connected between short-circuited plus and minus portions of the solar cell module and a portion of the roofing plate (zinc-coated steel plate) from which the coating was removed. Measurement was also performed by inverting the polarity of the applied voltage, and a larger maximum leakage current was indicated in FIG. 10.

As shown in FIG. 10, the leakage current increases abruptly when the width of the back insulating member 109 compared to that of the solar cell 101 becomes minus. That is, the insulation breakdown voltage of the solar cell module is insufficient if no back insulating member 109 is provided between some portions of the solar cell 101 and the roofing plate 107. Conversely, it is seen that if the width distance is plus 1 mm or more, the insulation breakdown voltage can be maintained at a sufficiently high level.

Figure 11:
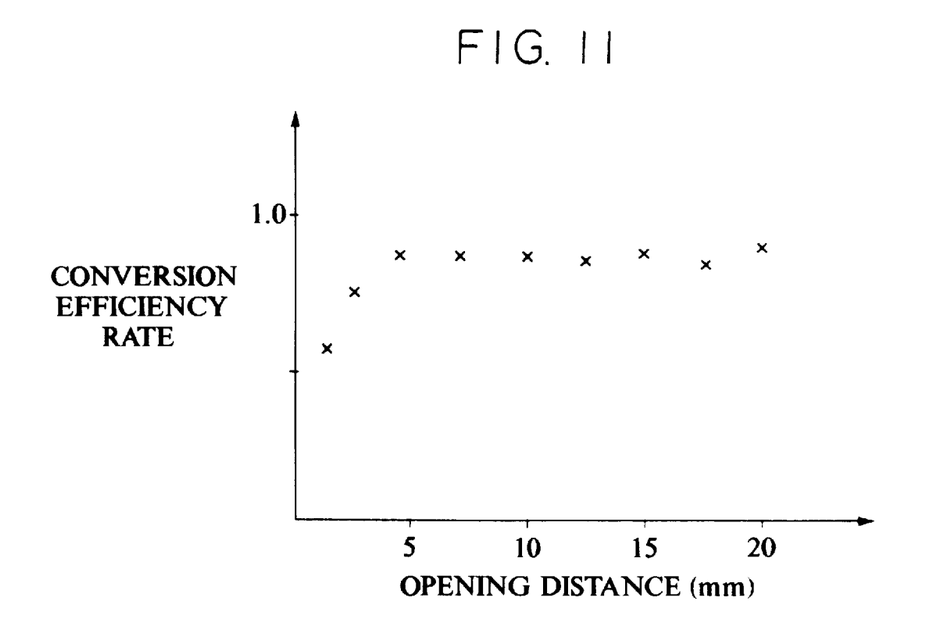
FIG. 11 is a graph showing the relationship between the average conversion efficiency/the initial average conversion efficiency ratio and the opening distance as the result of an experiment conducted with the present invention.

FIG. 11 shows the relationship between the minimum distance between the ends of the back insulating member in the solar cell module and the ends of openings through which nails, screws or staples 111 are driven to fix the solar cell module (hereinafter referred to as "opening distance") and the reduction in the conversion efficiency of the solar cell from the value before the weatherproofing test to the value after the weatherproofing test. The openings were formed with a distance of 1 mm or more from the solar cell considering the result show in FIG. 10. The weatherproofing test was made by preparing three test samples with respect to each of different opening distance values and by using a sunshine weather meter having the following operating conditions: a temperature of 40° to 50° C. on a black panel, a xenon lamp output of 1.5 kW, a wavelength range of 300 to 800 nm, irradiation intensity of 1,425 W/m$^2$, and 50/50 bright-dark cycles. Changes in conversion efficiency were measured after 1,000 hours of testing.

The amount at which the conversion efficiency of the solar cell module was reduced by the weatherproofing test was calculated by the ratio of (the average conversion efficiency after the weatherproof test)/(the initial average conversion efficiency). When the ratio is 1, there is no reduction.

From the result shown in FIG. 11, it can be understood that when the opening distance is 5 mm or more, the changes in conversion efficiency are not substantially large. It is thought that with respect to the opening distance of 5 mm or more, that is, when nails 111 were excessively close to the back insulating member, fissures or cracks were formed in the back insulating member due to stresses at the nailed portions after the weatherproofing test, and that in this situation water could penetrate easily from the outside to the back insulating member, thereby reducing the conversion efficiency of the solar cell module.

It is understood from this test that each of the distances from the solar cell and the opening distance bears a certain relationship to the performance of the solar cell module.

Figure 1A:
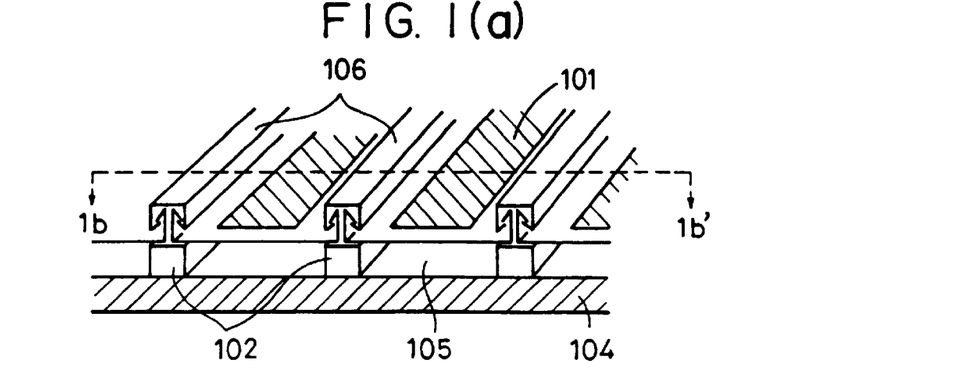
FIG. 1(a) is a schematic diagram showing the construction of a passive solar system using a solar cell module in accordance with the present invention.
Figure 1B:
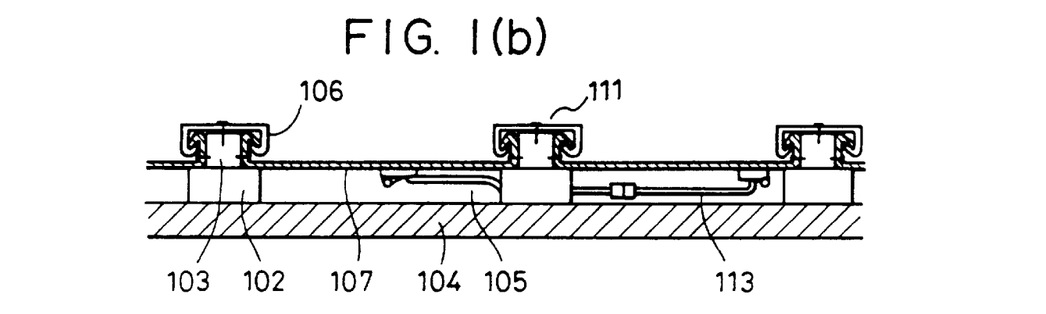
FIG. 1(b) is a schematic cross-sectional view of the solar cell module taken along the line 1b–1b' of FIG. 1(a)
Figure 1C:
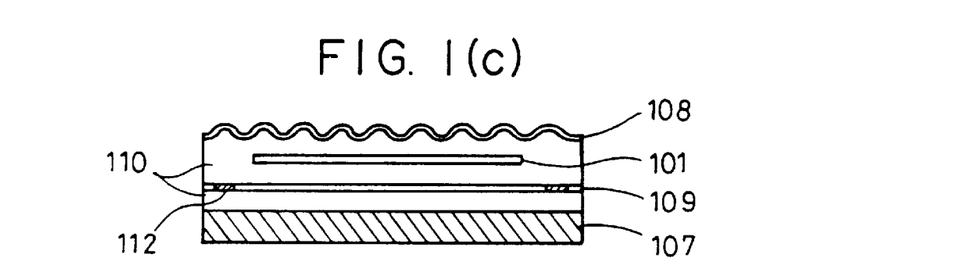
FIG. 1(c) is a structural cross-sectional view of the solar cell module of the present invention.
Figure 1D:
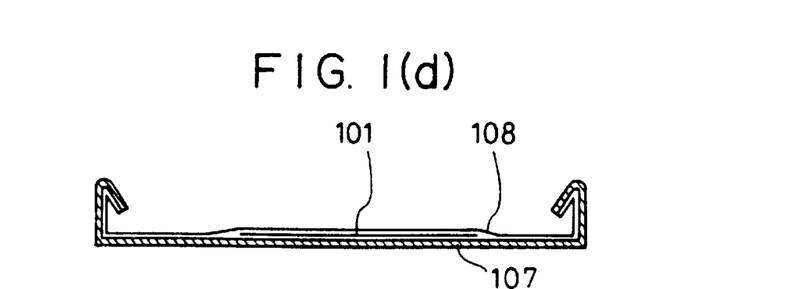
FIG. 1(d) is a diagram showing a bent state of the solar cell module with a roofing member for use in the passive solar system in accordance with the present invention.

Referring in detail to FIGS. 1(a) through 1(d), a solar cell module in accordance with the present invention includes a photoelectric conversion element, i.e., a solar cell 101, a spacer 102, a core member 103, a roof board 104, a vent layer 105, caps 106 nailed at 111, roofing plates 107, and a solar cell module which is integrally formed on each roofing plate 107, and which is composed of a solar cell 101, a surface cover member 108 having a roughened surface, a back insulating member 109, and a filler 110. The back insulating member 109 has openings 112 through which nails or the like are passed. A power connection cable 113 is connected to the solar cell. As shown in FIG. 1(c), the members of the solar cell module are superposed one on another in such a manner as to sandwich the solar cell 101 and are enclosed in a laminated structure with a resin. Thereafter, opposite end portions of the solar cell module are bent so as to extend vertically upwardly, as shown in FIG. 1(d). Then, the roofing plate 107 integrally combined with the solar cell module which has been bent is fitted and fixed on the spacers 102 and adjacent surfaces of core member 103, thereby forming vent layer 105 between the roof board 104 and the roofing plate 107. Further, caps 106 are mounted in such a manner as to grasp together the tops of core members 103 and the vertical bent portions of the roofing plates 107. Finally, the vertical bent portions of the solar cell module and the caps are fixed to core member 103 with screws, nails, or staples 111.

Power from each solar cell 101 is supplied to a load (not shown) via connection cable 113.

Solar Cell 101

Figure 2:
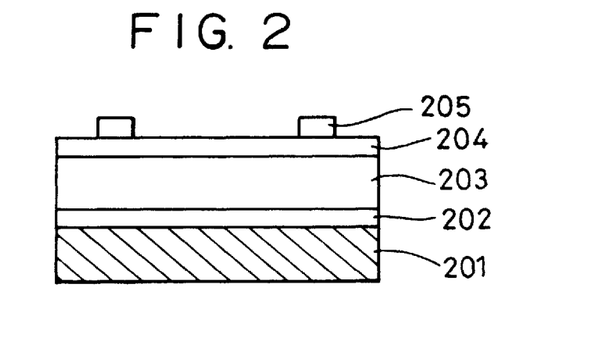
FIG. 2 is a schematic cross-sectional view of a solar cell suitable for use in the solar cell module of the present invention.

Any solar cell or photoelectric conversion element may be used in accordance with the present invention. However, a flexible solar cell is preferred. For example, a solar cell having a semiconductor photoactive layer formed as a photoelectric conversion member on an electroconductive base may be used. FIG. 2 is a schematic cross-sectional view of an example of such a solar cell. The structure shown in FIG. 2 includes an electroconductive base 201, a reflecting layer 202 for reflecting light not absorbed by the semiconductor photoactive layer, semiconductor photoactive layer 203, a transparent electroconductive layer 204 for improving the current collecting efficiency of the semiconductor photoactive layer, and current collecting electrodes 205.

The electroconductive base 201 may serve both as a base for the photovoltaic element and as a lower electrode. The material of the electroconductive base 201 may be silicon, tantalum, molybdenum, tungsten, stainless steel, aluminum, copper, titanium, a carbon sheet, a lead-plated steel plate, or a resin film or a ceramic on which an electroconductive layer is formed. If light is incident on the electroconductive base side, the electroconductive base 201 is formed of a transparent material. A metallic layer, metallic oxide layer or a lamination of a metallic layer and a metallic oxide layer may be formed as reflecting layer 202 on the electroconductive base 201. For example, the metallic layer may be formed of Ti, Cr, Mo, W, Al, Ag, Ni, or an alloy of some of these metals, and the metallic oxide layer may be formed of ZnO, TiO$_2$, SnO$_2$ or In$_2$O$_3$-SnO$_2$ (ITO). Such metallic layer and metallic oxide layer may be formed by ohmic-resistance heating, electron beam deposition, or sputtering.

In the semiconductor photoactive layer 203, photoelectric conversion is effected. Examples of the material of the semiconductor photoactive layer 203 are pn junction type polycrystal silicon, pin junction type amorphous silicon, compound semiconductors, such as CuInSe$_2$, CuInS$_2$, GaAs, CdS/Cu$_2$S, CdS/CdTe, CdS/InP, and CdTe/Cu$_2$Te, and a lamination of some of these materials. If the material of the semiconductor photoactive layer is polycrystal silicon, the semiconductor photoactive layer may be formed by forming molten silicon into a sheet or heat-treating non-single crystal silicon. In the case of non-single crystal and amorphous silicon, the semiconductor photoactive layer may be formed by plasma chemical vapor deposition (CVD) using a silane gas such as $SiH_4$ or $SiF_4$ as a raw-material gas. In the case of a compound semiconductor, the semiconductor photoactive layer may be formed by ion plating, ion beam deposition, vacuum deposition, sputtering, or electrodeposition.

The transparent electroconductive layer 204 serves as an upper electrode of the solar cell. Examples of the material used to form the transparent electroconductive layer 204 are $In_2O_3$, $SnO_2$, $In_2O_3$-$SnO_2$ (ITO), ZnO, $TiO_2$, $Cd_2SnO_4$, a crystalline semiconductor doped with impurity at a high concentration, and a metal through which light absorbed by the semiconductor photoactive layer 203 can pass. The transparent electroconductive layer 204 may be formed by ohmic-resistance heating deposition, sputtering, spraying, CVD, or impurity diffusion.

To efficiently collect current on the transparent electroconductive layer 204, a grid-like current collecting electrode 205 may be provided. Examples of the material of the current collecting electrode 205 are Ti, Cr, Mo, W, Al, Ag, Ni, Cu, Sn, alloys of some of these metals, and electroconductive pastes such as silver paste and carbon paste. The current collecting electrode 205 may be formed by sputtering using a mask pattern, ohmic-resistance heating, CVD, by depositing a metallic film over the entire surface and thereafter performing patterning by removing unnecessary portions by etching, by forming a mask for a negative pattern for a grid electrode pattern and thereafter performing plating, by printing an electroconductive paste, or by fixing metallic wires with an electroconductive paste. The electroconductive paste may be prepared by dispersing a fine powder of silver, gold, copper, nickel, an alloy of some of these metals or carbon in a binder polymer made of, for example, a polyester resin, an epoxy resin, an acrylic resin, an alkyd resin, polyvinyl acetate, rubber, urethane, or a phenolic resin.

Examples of the methods for manufacturing the solar cell have been described. If the solar cell of the present invention is a single crystal silicon solar cell, the conversion efficiency is liable to decrease under the influence of heat since the ambient temperature during use of the solar cell of the present invention is high. It is known that the influence of heat on the conversion efficiency of an amorphous silicon solar cell under a high-temperature condition is generally smaller than that for a single crystal silicon cell.

Additionally, the thickness of amorphous silicon solar cell is smaller than that of single crystal silicon solar cell. Therefore, an amorphous silicon solar cell is superior to single crystal silicon solar cell with respect to heat transfer efficiency when used in association with a roofing plate in accordance with the present invention.

The thickness of an amorphous silicon solar cell formed on a stainless steel substrate can be reduced to about 0.1 mm. In such a case, the amount of filler in the solar cell can be reduced. Accordingly, the total thickness of the roofing plate integrally combined with the solar cell module can be reduced, thus achieving an improvement in heat transfer efficiency. Such a solar cell is flexible because it is formed on a stainless steel substrate. Therefore, an unnecessarily large stiffness of the roofing plate is not required. Thus, the thickness of the roofing plate can be reduced and, accordingly, a further improvement in heat transfer efficiency can be achieved.

It thus can be understood that an amorphous silicon solar cell formed on a stainless steel substrate is preferred as the solar cell of the present invention.

Opposite end portions of the roofing plate are bent vertically upwardly so as to be capped for flashing. Accordingly, it is preferable to shape the roofing plate by bending its opposite end portions vertically upwardly.

Roof Board 104

Roof board 104 is used as a backing for roofing. Required qualities of roof board 104 are the ability of withstanding a local load caused by a worker walking on the roof board, water resistance and heat resistance. Wood, mortar, or cement is ordinarily used as a material for such a roof board.

Cap 111

Caps 111 are used for fixing the roofing plate 107 on the core wood 103 as well as for flashing. The material of caps 111 is, for example, a metallic member such as zinc-coated steel plate processed to have an insulating property.

Spacer 102

Spacers 102 are fixed on roof board 104 and roofing plates 107 are placed on the spacers 102 to maintain the vent layer of the passive solar system. Wood is preferably used as the material of the spacers 102.

Core Member 103

Core members 103 are fixed on spacers 102 and roofing plates 107 are fixed to core wood 103 with nails 111, staples or bolts. Wood is preferably used as the material of core members 103.

Materials laminated to form the solar cell module of the present invention will now be described.

Surface Cover Member 108

Required properties of the surface cover member 108 are transparency, weather resistance and the ability of repelling contaminants. If glass is used as the material of the surface cover member 108, the thickness of roofing plate 107 including the solar cell module may become so large that the heat transfer efficiency is considerably reduced, and the glass is easily broken by an external impact. Therefore, a weatherproof transparent film of an organic resin is preferably used as the material of the surface cover member 108. The surface of the surface cover member 108 may be roughened to reduce surface reflection of incident light so that the light utilization efficiency of the solar cell is improved. Examples of the material of the surface cover member 108 are film of a fluorocarbon resin such as polyethylene tetrafluoroethylene (PTFE), polyethylene trifluoride or polyvinyl fluoride. The surface to be bonded to filler 110 may be processed by corona discharge so that filler 110 can adhere to it easily. To improve the heat resistance of a fluorocarbon resin used to form the surface cover member, an antioxidant may be added.

Filler 110

Required properties of filler 110 are weather resistance, thermoplasticity, a heat-bonding property, and transparency. Examples of the material of filler 110 are transparent resins such as ethylene-vinyl acetate copolymer (EVA), a butyral resin, a silicon resin, an epoxy resin, a fluorinated polyimide resin and an acrylic resin. The filler 110 material can be cross-linked by adding a crosslinker. Preferably, an ultraviolet absorber is also added to limit photo-degradation.

Back Insulating Member 109

Back insulating member 109 is used to maintain electrical insulation between solar cell 101 and the outside and between solar cell 101 and roofing plate 107. In the case of using roofing plate 107 as a heat collecting metal as in the present invention, it is necessary for the solar cell module to have an improved electrical insulation effect in comparison with ordinary solar cell modules because the solar cell module is used in a high-temperature high-humidity condition. The filler 110 itself has a certain insulating property. However, there is a risk of occurrence of a short-circuit between the solar cell 101 and the outside of between the solar cell 101 and the back reinforcement member 107 at a small-thickness portion or a pin hole portion, which is considered a serious defect in the case of the conventional art. The back insulating member 109 is used to prevent such short-circuit.

If a portion of filler 110 at the end of solar cell 101 is not sufficiently degassed or the thickness thereof is excessively small in the case of an arrangement where back insulating member 109 extends only through an area immediately below the solar cell 101, then the portion can have an extremely small insulation breakdown voltage. Therefore, it is preferable to laminate back insulating member 109 through the entire area of the solar cell module. However, if back insulating member 109 is laminated through the entire area of the solar cell module, and if through holes are formed in spacers 102 and core members 103 for fixing the solar cell module, back insulating member 109 is liable to crack or separate at the interface with the filler at pierced positions during long-term outdoor use. This is due to stresses caused when the back insulating member is affixed with screws, nails, or staples 111 in pierced portions. Accordingly, it is necessary to provide openings or through holes in the portions of back insulating member 109 at which screws, nails, or staples are passed through insulating member 109 to affix the solar cell module.

The material of back insulating member 109 is, preferably, a material capable of maintaining a sufficiently high electrical insulating effect with the solar cell, having improved long-term durability and flexibility such as to withstand thermal expansion and contraction. Preferable examples of such a material are nylon, polyethylene terephthalate (PET), polycarbonate, polyester, polyarylate, and polyamide.

Back Reinforcement Member 107

In the passive solar system of the present invention, back reinforcement member 107 is used as roofing plate 107, and also serves as a heat collecting plate. Required qualities of back reinforcement member 107 are heat resistance, weather resistance, and stiffness. However, a bonding property is also required since there is a need to bond filler 110 for covering the solar cell. The material of back reinforcement member 107 is, for example, a metal treated to have an insulating property, such as a zinc-coated steel plate. The selection of a surface colored back reinforcement member 107 is important, considering its use as a solar heat collecting plate. Preferably, back reinforcement member 107 has a surface color which provides a high solar heat collecting efficiency, e.g., black, dark blue, or brown.

Opposite end portions of back reinforcement member 107 can be bent vertically upwardly and capped for flashing.

Method of Bending Solar Cell Module

The invention does not pose any restriction on the method of bending the solar cell module. It is to be noted, however, that the surface covering member 108 tends to be damaged upon bending when it is made of a weather-resistant material such as a fluoro-carbon resin film. Therefore, the anvil or die of the bending machine for bending the solar cell module is preferably made of a material that exhibits a lesser tendency to damage the surface covering member 108 providing the surface of the roofing plate. For instance, the anvil may be made of a comparatively soft material such as urethane resin. The bending is performed by placing the weather-resistant film on such an anvil and then exerting a force on the roofing plate as the underlying architectural member by means of a blade pressed against the roofing plate 107.

The invention will be more fully understood from the following Examples:

EXAMPLE 1

A solar cell, comprising an amorphous silicon (a-Si) photoelectric conversion element, was produced by a process which will be described with reference to FIG. 2.

An Al layer 5000 Å thick and a ZnO layer of 5000 Å thick were formed by sputtering in the mentioned order on a rinsed stainless steel substrate 201, thus forming a back reflecting layer 202. Then, an a-Si layer of n conductivity type was formed by a plasma CVD process from a gas mixture containing $SiH_4$, $PH_3$, and $H_2$, followed by formation of an a-Si layer of i conductivity type by a plasma CVD process from a gas mixture containing $SiH_4$ and $H_2$. Thereafter a micro-crystalline silicon ($\mu$c-Si) layer of p conductivity type was formed also by a plasma CVD process from a gas mixture containing $SiH_4$, $BF_3$, and $H_2$, thereby forming a tandem a-Si photoelectric conversion semiconductor layer 203 having a laminate structure expressed by n-layer 150 Å/i layer 4000 Å/p layer 100 Å/n layer 100 Å/i layer 800 Å/p layer 100 Å. Then, an $In_2O_3$ thin film (700 Å thick), serving as a transparent electrode 204, was formed by deposition, through heating in an $O_2$ atmosphere by resistance heating.

Then, a collecting electrode 205 was formed by pattern printing with a silver paste by means of a screen printing device, followed by drying.

The solar cell thus obtained was covered to form a solar cell module of the invention which is integrated with the roofing plate, in accordance with a process which will now be described with specific reference to FIGS. 3(a) and 3(b) which respectively are a top plan view and a sectional view of the solar cell module. As will be seen from these Figures, the solar cell module has a solar cell 301, a covering member 302, a back insulating member 303, a roofing plate 304, and a filler 305. Numeral 306 designates a bend.

Figures 3A, 3B:
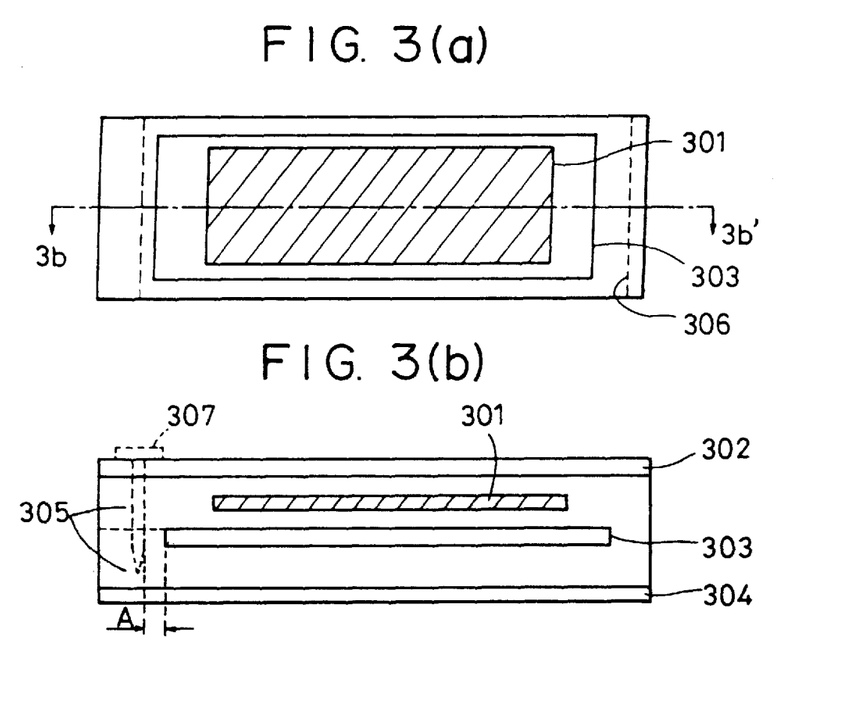
FIG. 3(a) is a plan view an example of the solar cell module of the present invention.
FIG. 3(b) is a schematic cross-sectional view of the solar cell module taken along the line 3b–3b' of FIG. 3(a)

As will be seen from FIGS. 3(a) and 3(b), the back insulating member 303 was so sized that its four sides are greater than the corresponding sides of the solar cell 301. The fabrication procedure is as follows. A stack was prepared by placing one atop the other in sequential order of the roofing plate 304, a layer of filler 305, insulating film 303, another layer of filler 305, the solar cell 301 produced by the foregoing process, still another layer of filler 305, and the surface covering member 302. The stack was then heated at 150° C. for 30 minutes so that the filler layers, which are made of ethylene-vinyl acetate copolymer as described later, were melted so as to act as bonding layers, whereby a laminated structure was obtained. During the stacking, the back insulating member was so aligned that its sides are 100 mm greater than the corresponding sides of the solar cell and the opening distance A was included between the side of nail 307 and the adjacent edge of the back insulating member 303. A zinc-coated steel sheet of 0.3 mm thickness, available from Daido Steel Sheet Corp. under the trade name of TAIMACOLOR GL, with a black surface, was used as the roofing plate 304. EVE (Ethylene Vinyl Acetate copolymer) of 460 microns thickness was used as the material of the filler. A nylon available from Du Pont under the trade name of DARTEK, 50 microns thick, was used as the material of the back insulating member. A fluoro-carbon resin film (film of ethylene tetrafluoroethylene of 50 microns thickness, (available from Asahi Glass Co., Ltd. under the trade name of AFLEX), was used as the material of the surface covering member.

Figure 4:
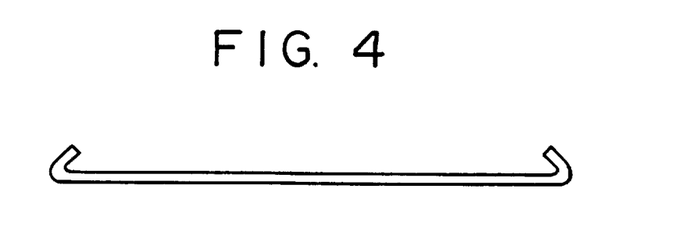
FIG. 4 is a cross-sectional view of a step in the process of manufacturing the solar cell module of the present invention.
Figure 5:
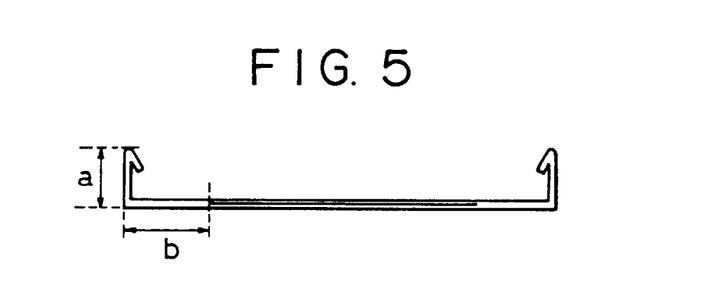
FIG. 5 is a schematic cross-sectional view of a suitable shape of the solar cell module of the present invention.

The solar cell module thus prepared was then subjected to bending. The bending was conducted in the manner as illustrated in FIGS. 4 and 5. Namely, as the first step, the solar cell module was bent at its each end through a 120° angle towards the source of the incident light, as shown in FIG. 4. The solar cell module as shown in FIG. 4 was then bent at a 90° angle towards the source of the incident light, i.e., vertically upward, at each end outside the power generating region. The 120° bending was conducted along a marginal line which is 20 mm from the extreme end of each side of the solar cell module. The 90° bending is preferably conducted such that the height "a" of the rise of each end of the module is smaller than the distance "b" between the base of the vertically upward bend and the adjacent end of the solar cell, i.e., so as to meet the condition of a<b. It is important that this condition is met, for otherwise the power generating performance is affected by shading created by the vertically upward ends of the module. Furthermore, the vertically upward bend at each end of the module was conducted along a line outside the back insulating member.

Figure 6:
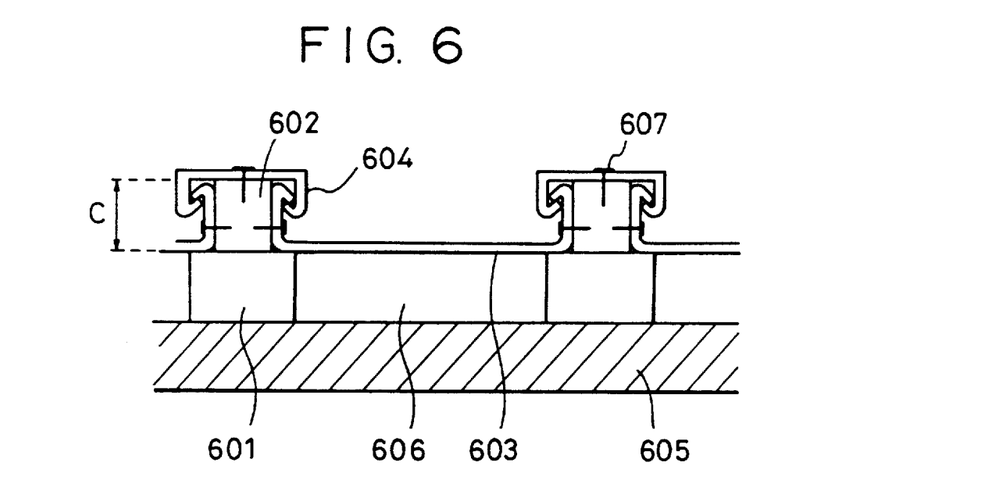
FIG. 6 is a schematic cross-sectional view of an example of a passive solar system using the solar cell module of the present invention.

The solar cell module after the bending was then placed on a roof board to form a roof structure, as will be understood from the following description taken in conjunction with FIG. 6. Referring to this figure, the roof structure has spacers 601, core members 602, the solar cell module 603, and the roof board 605. Numeral 606 denotes vent layer, while 607 designate nails. As the first step, spacers 601 were fixed to the roof board 605 by, for example, nails, and the core members 602 were fixed to the respective spacers 601 by nails or the like. Then, the solar cell module 603, bent in the form as shown in FIG. 5, was placed between adjacent spacers 601, such that each end portion of the module 603 rests on a shoulder defined on each spacer 601 by the cooperating core member 602. The bending of the solar cell module had been performed so that the height (a) of the vertically upward bend equals the height "C" of the core member 602 above the level of the upper face of the spacer 601. Then caps 604 were placed such that each cap 604 clamps and covers the tops of the vertical upward bends of the adjacent solar cell modules 603. The cap 604 was bent so as to be engageable with the bent end extremities of the solar cell modules 603. Finally, the caps 604 and the vertically upward bends of the solar cell modules were fixed to the core members by means of nails 607. It will be seen that the back insulating member of the solar cell module does not reach the region where the nails are driven.

Thus, a solar cell module was obtained having a distance of plus 10 mm from the solar cell and an opening distance of 80 mm which is the smallest distance A between the end of a nail 307 and the adjacent edge of the back insulating member 303 (FIG. 3(b)).

EXAMPLE 2

Figure 7A:
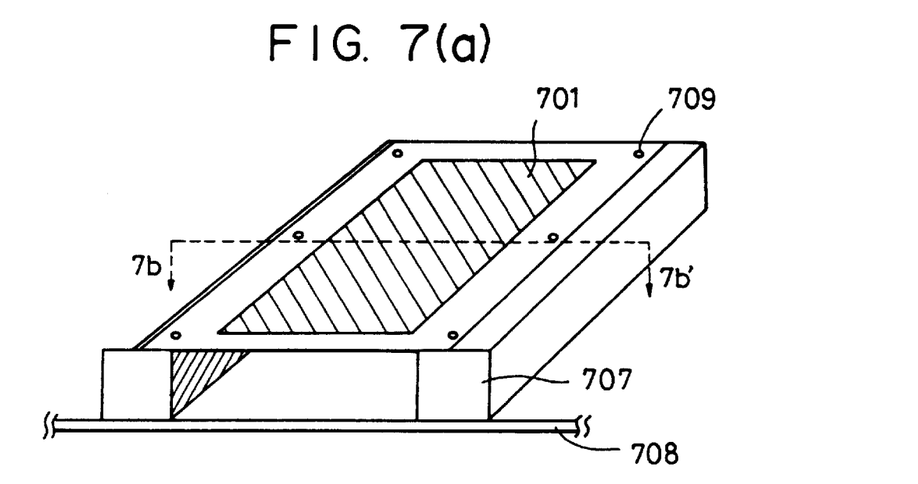
FIG. 7(a) is a schematic diagram of an example of the solar cell module of the present invention and a passive solar system using the solar cell module.
Figure 7B:
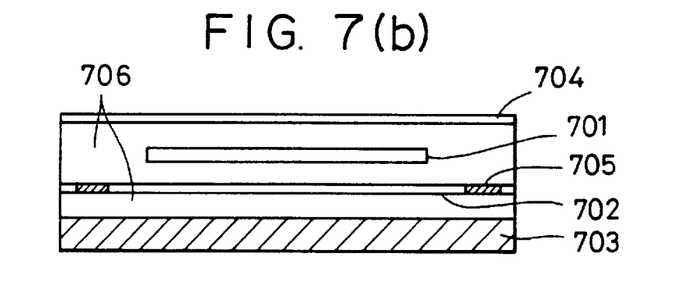
FIG. 7(b) is a cross-sectional view taken along the line 7b–7b' of FIG. 7(a)
Figure 7C:
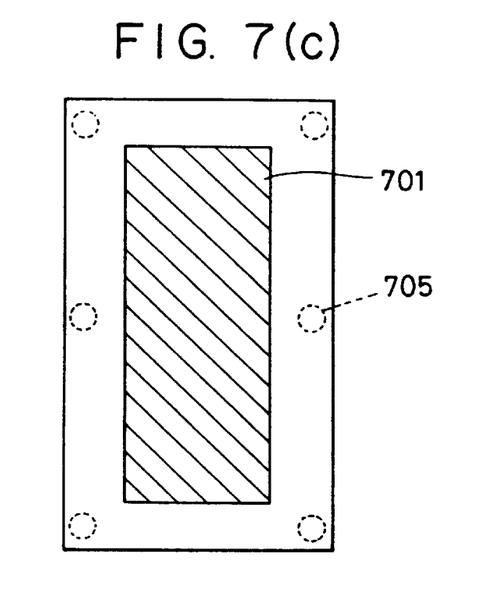
FIG. 7(c) is a top view of FIG. 7(a)

A structure was fabricated in the same manner as Example 1, except that circular regions of 10 mm radius centered at the respective pierced portions were punched out from the back insulating member, and the solar cell module was not subjected to bending. FIG. 7(a) is a perspective view of the solar cell module of this Example, FIG. 7(b) is a sectional view taken along line 7b–7b' of FIG. 7(a), and FIG. 7(c) is a top plan view. Referring to these Figures, the structure has a solar cell 701, back insulating member 702, roofing plate 703, surface covering member 704, filler 706, spacers 707, and a roof board 708. The circular regions formed by punching the back insulating member are denoted by 705. Numeral 709 designates nails. The same laminating process was employed as that used in Example 1. The solar cell module was affixed by nails 709 which were driven at the centers of the respective punched circular regions. In this example, the distance from the solar cell was plus 80 mm and the opening distance A was 10 mm.

EXAMPLE 3

The same process as that used in Example 1 was employed, except that the back insulating member was sized to have each side 1 mm greater than that of the solar cell and positioned such that each side thereof projects 1 mm beyond corresponding side of the solar cell, as shown in FIG. 3(a). In this Example, the distance from the solar cell was plus 1 mm, while the opening distance A was 89 mm.

EXAMPLE 4

The same process as that used in Example 2 was employed, except that the radius of the circular punched regions was 3 mm. In this Example, the distance from the solar cell was plus 87 mm, while the opening distance A was 3 mm.

Comparative Example 1

The same process as that used in Example 1 was employed, except that the back insulating member was placed over the entire area of the solar cell in forming the laminate. In this Example, the distance from the solar cell was plus 100 mm, while the opening distance A was 0 mm.

Comparative Example 2

The same-process as that used in Example 1 was employed, except that the back insulating member was so sized that each side thereof was 5 mm smaller than the corresponding side of the solar cell (photovoltaic device). In this Example, the distance from the solar cell was minus 5 mm, while the opening distance A was 95 mm.

(Evaluation)

The solar cell modules of Examples and Comparative Examples fabricated in accordance with the foregoing processes were subjected to tests for the purpose of evaluation of the following:

(1) Initial insulation leakage (2) Initial conversion efficiency (3) Conversion efficiency after experiencing irradiation + rain cycle (sunshine weather meter)

(4) Reduction of conversion efficiency from initial value due to the irradiation + rain cycle (5) Appearance after experiencing irradiation + rain cycle (sunshine weather meter)

The insulation leakage test was conducted by shelving each sample for 500 hours in an environment of 85° C. and 85% RH, and applying, within 2 minutes after taking the sample out of the environment, a voltage of 2200 V to the solar cell module of each sample, and measuring the maximum leakage current under application of the voltage. The voltage was applied between a point where the plus and minus electrodes of the solar cell were short-circuited and a portion of the roofing plate (zinc-coated steel sheet) where the zinc coat was peeled to expose the naked steel. The current was measured two times while inverting the polarity of the voltage applied, and the greater value of the measured current was made of record as the maximum leakage current.

The sunshine weather metering was conducted under the conditions of: the temperature on the black panel being 40° to 50° C., humidity being 65%, xenon lamp output being 1.5 Kw, wavelength region being 300 to 800 nm, irradiation intensity being 1425 w/m2, and bright/dark cycle being 50/50.

Results and Discussion

The results of measurements of the items (1), (4) and (5) above are shown in Table 1 below.

TABLE 1

Results of Comparison Tests

|  | Insulation Leakage Current | Reduction Rate | Appearance After Test |
|---|---|---|---|
| Example 1 | 5 μA | 8% | No change |
| Example 2 | 6 μA | 10% | No change |
| Example 3 | 25 μA | 8% | No change |
| Example 4 | 6 μA | 8% | Small cracks occurred around the nails. |
| Comparative Example 1 | 5 μA | 27% | Crack patterns were formed around the nails to a position below the solar cell. |
| Comparative Example 2 | 80 μA | 15% | No change |

From Table 1, it is understood that the solar cell module of Comparative Example 1 after the tests showed a drastic change in appearance, due to generation of crack-like patterns in the nylon as the back insulating member. It is considered that the large reduction in the conversion efficiency exhibited by this sample is attributable to invasion by water along the cracks. The solar cell module of Comparative Example 2 also was found to be unacceptable due to too large a leakage current, indicative of insufficiency of insulation.

The solar cell module of Example 3 showed a comparatively large leakage current. This is considered to be attributable to the fact that the size of the back insulating member approximates that of the solar cell. The solar cell of Example 4 showed cracking around the nails, though the conversion efficiency was not so much affected. Such cracking results from too small a distance between the back insulating member and the pierced portion of the solar cell module.

As will be understood from the foregoing description, the present invention offers the following advantages:

(1) Degradation of laminate materials around each pierced portion is suppressed so that the long-term reliability of the solar cell module is improved.

(2) Electrical power generated by the solar cell can be used for driving a blower which efficiently circulates air, thus realizing a non-polluting energy system.

(3) Any surplus electric power can be used as electrical power source for devices other than the blower.

(4) The solar cell can be practically used without requiring any specific supporting structure.

(5) The heat absorbed by the solar cell due to irradiation with sunlight is carried away by air flowing through the vent layer, so that the solar cell is effectively cooled, thus preventing reduction in the conversion efficiency which otherwise may occur due to increase the temperature of the solar cell.

(6) The resin used as the covering material covering the solar cell is flexible enough to cover the entire area of a roof, thus contributing to reduction in the noise produced by rain drops.

(7) Also, the resin, in cooperation with the caps which provide sufficiently large air tightness, ensures improved waterproofing property against rain fall.

While the present invention has been described with respect to what is presently considered to be the preferred embodiments, it is to be understood that the invention is not limited to the disclosed embodiments. The present invention is intended to cover the various modifications and equivalent arrangements included within the spirit and scope of the appended claims.

What is claimed is:

1. A roof member comprising:
    a. a roof panel formed of steel, having a bend line;
    b. a photovoltaic array comprising a plurality of non-single crystal semiconductor elements on the upper surface of said roof panel, wherein the non-single-crystal semiconductor elements are arranged to receive sunlight; and
    c. an insulating member between said roof panel and the non-light-receiving side of the non-single-crystal semiconductor elements, wherein said insulating member occupies an area larger than the area occupied by the non-single-crystal semiconductor elements, and whose end portion is located between said bend line and the edges of said non-single-crystal semiconductor elements.

2. A roof member according to claim 1, wherein a filler member is arranged between said photovoltaic array and said insulating member.

3. A roof member according to claim 1, wherein a filler member is arranged between said insulating member and said roof panel.

4. A roof member according to claim 1 comprising a member which covers the surface of said photovoltaic array.

5. A roof member according to claim 1, wherein said non-single-crystal semiconductor elements comprise non-single crystal silicon.

6. A roof member according to claim 5, wherein said non-single-crystal silicon is amorphous silicon.

7. A roof member according to claim 5, wherein said non-single-crystal silicon is polysilicon.

8. A roof member comprising:
    a. a roof panel formed of steel which is bent;
    b. a photovoltaic array comprising a plurality of non-single crystal semiconductor elements on the upper surface of said roof panel, wherein the non-single-crystal semiconductor elements are arranged to receive sunlight; and
    c. an insulating member between said roof panel and the non-light-receiving side of said non-single-crystal semiconductor elements, wherein said insulating member occupies an area larger than the area occupied by said non-single-crystal semiconductor elements, and whose end portion is located between the bent portion of said roof panel and the edge of said non-single-crystal semiconductor elements.

9. A roof member according to claim 8 wherein a filler member is arranged between said photovoltaic array and said insulating member.

10. A roof member according to claim 8, wherein a filler member is arranged between said insulating member and said roof panel.

11. A roof member according to claim 8 comprising a member which covers the surface of said photovoltaic array.

12. A roof member according to claim 8, wherein said non-single-crystal semiconductor elements comprise non-single crystal silicon.

13. A roof member according to claim 12 wherein said non-single-crystal silicon is amorphous silicon.

14. A roof member according to claim 12, wherein said non-single-crystal silicon is polysilicon.

15. A solar cell member comprising:
    a. a steel panel having a bend line;
    b. photovoltaic array comprising a plurality of non-single-crystal semiconductor elements on the upper surface of said steel panel, wherein the non-single-crystal semiconductor elements are arranged to receive sunlight; and c. an insulating member between said steel panel and the non-light-receiving side of the non-single-crystal semiconductor elements, wherein said insulating member occupies an area larger than the area occupied by the non-single crystal semiconductor elements, and whose end portion is located between said bend line and the edge of said non-single crystal semiconductor elements.

16. A solar cell member according to claim 15, wherein a filler member is arranged between said photovoltaic array and said insulating member.

17. A solar cell member according to claim 15,
wherein a filler member is arranged between said insulating member and said panel.

18. A solar cell member according to claim 15 comprising a member which covers the surface of said photovoltaic array.

19. A solar cell member according to claim 15, wherein said non-single crystal semiconductor elements comprise non-single crystal silicon.

20. A solar cell member according to claim 19, wherein said non-single-crystal silicon is amorphous silicon.

21. A solar cell member according to claim 19, wherein said non-single crystal silicon is polysilicon.

22. A method of manufacturing a roof member, comprising:

a. preparing a roof panel formed of steel, having a bend line;

b. placing a photovoltaic array comprising a plurality of non-single-crystal semiconductor elements on the outer surface of said roof panel so that the non-single-crystal semiconductor elements can receive sunlight; and c. placing an insulating member between said roof panel and the non-light-receiving side of said non-single-crystal semiconductor elements, wherein the insulating member occupies an area larger than the area occupied by the non-single-crystal semiconductor elements, and positioning the insulating member so that the end portions thereof are between said bend line and the edge of said non-single-crystal semiconductor elements.

23. A method of manufacturing a roof member according to claim 22, wherein a filler member is arranged between said photovoltaic array and said insulating member.

24. A method of manufacturing a roof member according to claim 22, wherein a filler member is arranged between said insulating member and said roof panel.

25. A method of manufacturing a roof member according to claim 22, comprising a member which covers the surface of said photovoltaic array.

26. A method of manufacturing a roof member according to claim 22, wherein said non-single-crystal semiconductor elements comprise non-single crystal silicon.

27. A method of manufacturing a roof member according to claim 26, wherein said non-single-crystal silicon is amorphous silicon.

28. A method of manufacturing a roof member according to claim 26, wherein said non-single-crystal silicon is polysilicon.

29. A method of manufacturing a roof member comprising:

a. preparing a roof panel formed of steel;

b. bending said steel panel along a bend line;

c. placing a photovoltaic array having a plurality of non-single-crystal semiconductor elements on the outer surface of said roof panel so that the non-single-crystal semiconductor elements can receive sunlight; and d. placing an insulating member between said steel panel and the non-light-receiving side of said non-single-crystal semiconductor elements, wherein the insulating member occupies an area larger than the area occupied by the non-single-crystal semiconductor elements, and positioning the insulating member such that its end portions are arranged between said bend line and the edge of said non-single-crystal semiconductor elements.

30. A method of manufacturing a roof member according to claim 29, wherein a filler member is arranged between said photovoltaic array and said insulating member.

31. A method of manufacturing a roof member according to claim 29, wherein a filler member is arranged between said insulating member and said roof panel.

32. A method of manufacturing a roof member according to claim 29, comprising a member which covers the surface of said photovoltaic array.

33. A method of manufacturing a roof member according to claim 29, wherein said non-single crystal semiconductor elements comprise non-single crystal silicon.

34. A method of manufacturing a roof member according to claim 33, wherein said non-single-crystal silicon is amorphous silicon.

35. A method of manufacturing a roof member according to claim 33, wherein said non-single crystal silicon is polysilicon.

36. A method of manufacturing a solar cell member, comprising:

a. preparing a panel formed of steel, having a bend line;

b. placing a photovoltaic array having a plurality of non-single-crystal semiconductor elements on the outer surface of said panel so that the non-single-crystal semiconductor elements can receive sunlight; and c. placing an insulating member between said panel and the non-light-receiving side of said non-single-crystal semiconductor elements, wherein the insulating member occupies an area larger than the area occupied by the non-single-crystal semiconductor elements, and positioning the insulating member so that the end portions thereof are between said bend line and the edge of said non-single-crystal semiconductor elements.

37. A method of manufacturing a solar cell member according to claim 36, wherein a filler member is arranged between said photovoltaic array and said insulating member.

38. A method of manufacturing a solar cell member according to claim 36, wherein a filler member is arranged between said insulating member and said panel.

39. A method of manufacturing a solar cell member according to claim 36 comprising a member which covers the surface of said photovoltaic array.

40. A method of manufacturing a solar cell member according to claim 36, wherein said non-single crystal semiconductor elements comprise non-single-crystal silicon.

41. A method of manufacturing a solar cell member according to claim 40, wherein said non-single-crystal silicon is amorphous silicon.

42. A method of manufacturing a solar cell member according to claim 40, wherein said non-single-crystal silicon is polysilicon.

43. A passive solar apparatus having a solar cell member and a thermal conversion member for converting sunlight into electricity and heat, wherein said solar cell member comprises:

a. a bent steel panel;

b. a photovoltaic array having a plurality of non-single-crystal semiconductor elements on the outer surface of said steel panel, said elements are arranged to receive the sunlight; and c. an insulating member between said steel panel and the non-light-receiving side of said non-single-crystal semiconductor elements, which occupies an area larger than the area occupied by the non-single crystal semiconductor elements, and whose end portion is positioned between said bend line and said non-single-crystal semiconductor elements.

44. A passive solar apparatus according to claim 43, wherein said thermal conversion member has a ventilation layer.

45. A passive solar apparatus according to claim 43, wherein a filler member is arranged between said photovoltaic array and said insulating member.

46. A passive solar apparatus according to claim 43, wherein a filler member is arranged between said insulating member and said panel.

47. A passive solar apparatus according to claim 43, comprising a member which covers the surface of said photovoltaic array.

48. A passive solar apparatus according to claim 43, wherein said non-single-crystal semiconductor elements comprise non-single-crystal silicon.

49. A passive solar apparatus according to claim 48, wherein said non-single-crystal silicon is amorphous silicon.

50. A passive solar apparatus according to claim 48, wherein said non-single-crystal silicon is polysilicon.

51. A method of installing a passive solar apparatus on a roof, comprising preparing a passive solar apparatus having a thermal conversion member for converting sunlight into heat and a solar cell member for converting sunlight into electricity, comprising: a) a steel panel having a bent portion and an end portion; b) a photovoltaic array having a plurality of non-single-crystal semiconductor elements on the outer surface of said steel panel, which are arranged to receive the sunlight; and c) an insulating member between said steel panel and the non-light-receiving side of said non-single-crystal semiconductor elements, which occupies an area larger than the area occupied by the non-single-crystal semiconductor elements, and whose end portions are arranged between said bent portion and the edge of said non-single-crystal semiconductor elements, further comprising fixing the passive solar apparatus to the roof through a portion of the steel panel which is between the bent portion and the end portion of the steel panel.

52. A method of installing a passive solar apparatus according to claim 51, wherein said thermal conversion member has a ventilation layer.

53. A method of installing a passive solar apparatus according to claim 51, wherein a filler member is arranged between said photovoltaic array and said insulating member.

54. A method of installing a passive solar apparatus according to claim 51, wherein a filler member is arranged between said insulating member and said steel panel.

55. A method of installing a passive solar apparatus according to claim 51, comprising a member which covers the surface of said photovoltaic array.

56. A method of installing a passive solar apparatus according to claim 51, wherein said non-single-crystal semiconductor element comprises non-single-crystal silicon.

57. A method of installing a passive solar apparatus according to claim 56, wherein said non-single-crystal silicon is amorphous silicon.

58. A method of installing a passive solar apparatus according to claim 56, wherein said non-single-crystal silicon is polysilicon.

59. A method of installing a passive solar apparatus according to claim 51, characterized by fixing said passive solar apparatus to a roof by means of nails positioned between said bent portion and the end portion of said steel panel.

60. A method of installing a passive solar apparatus according to claim 51, comprising fixing said passive solar apparatus to a roof by means of staples positioned between said bent portion and said end portion of the steel panel.

61. A method of installing a solar cell member on a roof, characterized by preparing a solar cell member having: a) a steel panel having a bent portion and an end portion; b) a photovoltaic array having a plurality of non-single-crystal semiconductor elements on the outer surface of said steel panel, which are arranged to receive sunlight; and c) an insulating member between said steel panel and the non-light-receiving side of said non-single-crystal semiconductor elements, which occupies an area larger than the area occupied by said non-single-crystal semiconductor elements, and whose end portions are arranged between said bent portion and the edge of said non-single-crystal semiconductor elements, and further comprising fixing the solar cell member to a roof through a portion of the steel panel which is between the bent portion and the end portion of the steel panel.

62. A method of installing a solar cell member according to claim 61, wherein a filler member arranged between said photovoltaic array and said insulating member.

63. A method of installing a solar cell member according to claim 61, wherein a filler member is arranged between said insulating member and said steel panel.

64. A method of installing a solar cell member according to claim 61, comprising a member which covers the surface of said photovoltaic array.

65. A method of installing a solar cell member according to claim 61, wherein said non-single-crystal semiconductor element comprises non-single-crystal silicon.

66. A method of installing a solar cell member according to claim 65, wherein said non-single-crystal silicon is amorphous silicon.

67. A method of installing a solar cell member according to claim 65, wherein said non-single-crystal silicon is polysilicon.

68. A method of installing a solar cell member according to claim 61, comprising fixing said solar cell member to a roof by means of nails positioned between said bent portion and said end portion of the steel panel.

69. A method of installing a solar cell member according to claim 61, characterized in fixing said solar cell member to a roof by means of staples positioned between said bent portion and said end portion of the steel panel.

* * * * *